United States Patent
Tsuji et al.

(10) Patent No.: US 10,655,209 B2
(45) Date of Patent: May 19, 2020

(54) ELECTROMAGNETIC SHIELD (71) Applicants: NORITAKE CO., LIMITED, Aichi (JP); NORITAKE ITRON CORPORATION, Mie (JP)

(72) Inventors: Hitoshi Tsuji, Mie (JP); Tadami Maeda, Mie (JP); Isamu Kanda, Mie (JP)

(73) Assignees: NORITAKE CO., LIMITED, Aichi (JP); NORITAKE ITRON CORPORATION, Mie (JP)

( * ) Notice: Subject to any disclaimer, the term of this patent is extended or adjusted under 35 U.S.C. 154(b) by 0 days.

(21) Appl. No.: 14/778,503

(22) PCT Filed: Mar. 20, 2014

(86) PCT No.: PCT/JP2014/057655
§ 371 (c)(1),
(2) Date: Sep. 18, 2015

(87) PCT Pub. No.: WO2014/148589
PCT Pub. Date: Sep. 25, 2014

(65) Prior Publication Data
US 2016/0289816 A1    Oct. 6, 2016

(30) Foreign Application Priority Data

Mar. 21, 2013   (JP) ................. 2013-057995

(51) Int. Cl.
C23C 14/18    (2006.01)
H05K 9/00    (2006.01)
(Continued)

(52) U.S. Cl.
CPC ........ C23C 14/185 (2013.01); C23C 14/0036 (2013.01); C23C 14/06 (2013.01);
(Continued)

(58) Field of Classification Search
CPC ............. H01L 51/0048; H01L 27/3244; H01L 51/5253; H01L 51/5281; H01L 27/3223;
(Continued)

(56) References Cited

U.S. PATENT DOCUMENTS 3,955,023 A * 5/1976 Blakely .................. H01L 33/00
174/258
4,978,812 A   12/1990 Akeyoshi
(Continued)

FOREIGN PATENT DOCUMENTS

CA   1322398 A   12/1988
CA   2324169 A1   4/2001
(Continued)

OTHER PUBLICATIONS

Abstract;—JP 11046086 A; dated Feb. 1999; Kim Ki-Hwan.*
(Continued)

*Primary Examiner* — Humera N Sheikh
*Assistant Examiner* — Elizabeth D Ivey
(74) *Attorney, Agent, or Firm* — Hedman & Costigan, P.C.; James V. Costigan; Kathleen A. Costigan (57)    ABSTRACT

There is provided an inexpensive electromagnetic shield that can achieve exceptional shielding and display visibility characteristics, and provide high environmental resistance as necessary. In an electromagnetic shield (1), an intermediate layer (3) is formed on a glass substrate (2) comprising soda lime glass, an electroconductive layer (4) of Al is formed thereon, and openings (5) are formed by wet etching on the intermediate layer (3) and the electroconductive layer (4) after these layers have been formed by sputtering or vacuum deposition. Furthermore, an ITO layer (6) is formed on the entire glass surface including the intermediate layer (3) and the electroconductive layer (4) after the openings (5) are formed. In this configuration, the intermediate layer (3)
(Continued)

comprises a mixture of at least one metal selected from chromium, molybdenum, and tungsten, and at least one oxide selected from oxides of silicon, oxides of aluminum, and oxides of titanium.

3 Claims, 6 Drawing Sheets (51) Int. Cl.
    *C23C 14/06*     (2006.01)
    *C23C 14/34*     (2006.01)
    *C23C 14/00*     (2006.01)
    *C23C 14/24*     (2006.01)
    *C23C 14/58*     (2006.01)

(52) U.S. Cl.
    CPC .......... *C23C 14/0688* (2013.01); *C23C 14/24* (2013.01); *C23C 14/34* (2013.01); *C23C 14/5873* (2013.01); *H05K 9/0084* (2013.01); *H05K 9/0094* (2013.01); *H05K 9/0096* (2013.01)

(58) Field of Classification Search
    CPC ........... H01L 27/3288; H01L 31/02167; H01L 31/022425; H05K 1/0274; H05K 1/09; H05K 9/0094; H05K 9/0096; H05K 2201/0209
    See application file for complete search history.

(56) References Cited

U.S. PATENT DOCUMENTS

| | | | |
|---|---|---|---|
| 2002/0086164 A1* | 7/2002 | Anzaki ............. | B32B 17/10174 428/432 |
| 2003/0094296 A1 | 5/2003 | Kojima | |
| 2015/0212244 A1* | 7/2015 | Kim ................... | C23C 14/0015 359/885 |

FOREIGN PATENT DOCUMENTS

| | | | |
|---|---|---|---|
| CN | 101535847 A | | 9/2009 |
| CN | 101636796 A | | 1/2010 |
| EP | 0322720 A2 | | 7/1989 |
| EP | 0917174 A2 | | 5/1999 |
| EP | 1096845 A1 | | 5/2001 |
| JP | 1-170098 A | | 7/1989 |
| JP | 11046086 A | * | 2/1999 |
| JP | 2000-200994 A | | 7/2000 |
| JP | 2000-323892 A | | 11/2000 |
| JP | 2001-127485 A | | 5/2001 |
| JP | 2003-036166 A | | 2/2003 |
| JP | 2005-340617 A | | 12/2005 |
| JP | 2006-252886 A | | 9/2006 |
| JP | 2007-27389 A | | 2/2007 |
| JP | 2010-87119 A | | 4/2010 |
| JP | 2012-61683 A | | 3/2012 |
| KR | 10-0130472 B | | 11/1997 |
| WO | 97/32458 A1 | | 9/1997 |
| WO | 03/045126 A1 | | 5/2003 |
| WO | WO 2014035196 A1 * | 3/2014 | ......... C23C 14/0015 |

OTHER PUBLICATIONS

Xu et al "Preparation, microstructure and properties of molybdenum alloys reinforced by in-situ Al2O3 particles". Int. Journal of Refractory Metals and Hard Materials; 30 (2012) pp. 208-212 (Year: 2012).*
Translation—JP11046086; Kitagawa et al.; 1999 (Year: 1999); (JPH1146087).*
International Search Report dated Jun. 24, 2014.
English Abstract for CN 101535847 A dated Sep. 16, 2009.
English Abstract for CN 101636796 A dated Jan. 27, 2010.
English Abstract for JP 2006-252886 A dated Sep. 21, 2006.

* cited by examiner

ELECTROMAGNETIC SHIELD

TECHNICAL FIELD

The present invention relates to an electromagnetic shield (an electromagnetic shield window) installed primarily on the front surface of a display to prevent electromagnetic waves from penetrating the display or being emitted out of the display.

BACKGROUND ART

In plasma display panels (PDPs), cathode ray tubes (CRTs), vacuum fluorescent displays (VFDs), liquid crystal displays (LCDs), or other displays, a plate- or film-shaped electromagnetic shield member is installed on the front surface thereof. An electromagnetic shield member prevents electromagnetic waves generated by the display from leaking out, and prevents erroneous operations and the like due to noise attacks from outside of the display. In addition to having an electromagnetic wave blocking (shielding) characteristics, such an electromagnetic shield member must also be highly translucent in order to ensure that the display is visible. Transparent electroconductive thin films are arranged over entire substrates as translucent electromagnetic shield members, but it has been difficult to achieve exceptional shielding and translucence. To overcome this problem, it has been proposed to weave metal fibers into a mesh and bond the mesh to a film, glass, or a polymeric base material. However, a mesh of metal fibers readily crinkles, moiré patterns or the like sometimes form when the mesh is joined to the display, and there have been cases of hindered visibility.

Various proposals have been made in order to improve visibility and the like. For example, it has been proposed that a black layer containing a black pigment and a glass component having a softening temperature of 550° C. or less, along with a metal layer containing silver ("Ag"), aluminum ("Al"), and other metals, be formed on a substrate by a predetermined manufacturing method (see Patent Document 1). Additionally, an electromagnetic shield film has been proposed in which a black layer and an electroconductive metal layer comprising Ag, copper ("Cu"), Al, and the like are formed on a transparent polymeric film by a vacuum process, after which the layers are etched while wet to form a light-transmissive portion having a predetermined opening ratio (see Patent Document 2). Additionally proposed is a feature of an electromagnetic shield member on which an Al mesh is laminated, wherein the thickness of a surface-layer Al oxide film is controlled (0-13 Å) to control non-uniformity of the opening area, in order to ensure etching pattern precision when the mesh is formed (see Patent Document 3).

PRIOR ART DOCUMENTS

Patent Documents

Patent Document 1: Japanese Laid-Open Patent Publication No. 2005-340617
Patent Document 2: Japanese Laid-Open Patent Publication No. 2000-200994
Patent Document 3: Japanese Laid-Open Patent Publication No. 2010-87119

SUMMARY OF THE INVENTION

Problems to be Solved by the Invention

In Patent Document 1, the manufacturing method involves coating a glass substrate with a metal layer and a black layer containing a black pigment and a glass component, forming a pattern in a photosensitive step, and baking the assembly at 350-500° C. When this baking is performed, there is a risk of the shielding characteristics being reduced due to the metal layer oxidizing and the resistance value increasing. Although oxidation can be suppressed if Ag or another precious metal is used, the metal layer will then be more expensive and manufacturing costs will rise. In Patent Document 2, because a polymeric film is used in the base material, there is a risk that light transmittance will be worse than with glass and coloration or the like will occur. A high degree of industrial technology is required to control the thickness of an Al oxide film to 0-13 Å as in Patent Document 3, which is impractical.

If glass is used instead of a polymeric film as the base material, transparency and transmittance will be high. Particularly, if soda lime glass, which is also used in household building materials and the like, can be employed as the glass, the electromagnetic shield can be manufactured at extremely low cost. However, a problem is presented in that that the Na in the soda lime glass can react with the moisture in the air to form NaOH, some of the glass melts, the Al or the like in the wire and the Ca in the glass react and gradually diffuse through the glass surface, the glass becomes cloudy, and the outward appearance is significantly compromised. Therefore, there is demand to retain high environmental resistance while using soda lime glass.

As a metal used in the electroconductive metal layer, Cu is detrimental to corrosion resistance, and the field of use is therefore limited. Ag is costly as described above. Al, however, has exceptional corrosion resistance, and Al matches thermal expansion coefficients with glass better than a polymeric film. However, because Al is highly reflective of visible light, a problem is presented in that the reflectance of the electromagnetic shield increases and the visibility characteristics of the display is hindered. To address this problem, a black layer comprising oxides of Cu, cobalt (abbreviated as Co below), chromium (abbreviated as Cr below), molybdenum (abbreviated as Mo below), titanium (abbreviated as Ti below), and the like (sometimes including metal simple substances constituting oxides) as materials is formed with the intention of reducing reflectance in Patent Document 2, but when glass is used as the base material, these oxides (and metals) do not yield a satisfactory black film.

The present invention was devised in order to address such problems, and the purpose of the invention is to provide an inexpensive electromagnetic shield that has exceptional shielding and display visibility characteristics, and that can provide high environmental resistance as necessary.

Means for Solving the Problem

In the electromagnetic shield of the present invention, an intermediate layer is formed on a glass substrate and an electroconductive layer of Al is formed thereon, wherein the electromagnetic shield is characterized in that: after the intermediate layer and the electroconductive layer are formed by sputtering or vacuum deposition, openings are formed by wet etching; and the intermediate layer comprises a mixture of at least one metal selected from Cr, Mo, and tungsten (abbreviated as W below), and at least one oxide selected from oxides of silicon (abbreviated as Si below), oxides of Al, and oxides of Ti.

The electromagnetic shield is characterized in that the glass substrate is a soda lime glass substrate, and a layer of indium tin oxide (abbreviated as ITO below) is formed over the entire glass surface including the intermediate layer and the electroconductive layer after the openings are formed.

The electromagnetic shield is characterized in that the intermediate layer is comprising either a mixture of Mo and an oxide of Al, or a mixture of W and an oxide of Si. Particularly, the electromagnetic shield is characterized in that the intermediate layer is a mixture of Mo and an oxide of Al, and the Al oxide content relative to the total amount of the mixture is 2-16 wt. %.

The electromagnetic shield is characterized in that the thickness of the intermediate layer is 5-500 nm, and the thickness of the electroconductive layer is 500-5000 nm.

The electromagnetic shield is characterized in that, when the electromagnetic shield is allowed to stand for 1000 hours in conditions with a temperature of 60° C. and a relative humidity of 95%, no clouding will occur in the glass surface.

Effect of the Invention

In the electromagnetic shield of the present invention, an intermediate layer is formed on a glass substrate and an electroconductive layer of Al is formed on the intermediate layer; after the intermediate layer and the electroconductive layer are sputtered or vacuum deposited, openings are formed by wet etching; and the intermediate layer comprises a mixture of at least one metal selected from Cr, Mo, and W, and at least one oxide selected from oxides of Si, oxides of Al, and oxides of Ti. Particularly, employing a glass substrate causes transmittance to be high, and forming an intermediate layer of a predetermined composition can greatly reduce the reflectance of visible light while an Al electroconductive layer is employed. As a result, exceptional shielding and display visibility characteristics are achieved.

A soda lime glass substrate is employed as the glass substrate and an ITO layer is formed over the entire glass surface including the intermediate layer and the electroconductive layer after the openings are formed, whereby the soda lime glass surface does not come into direct contact with water vapor in the atmosphere. Therefore, material costs are kept low, the plate has high environmental resistance, and clouding of the glass can be prevented even in high-temperature and high-humidity environments and the like.

MODE FOR CARRYING OUT THE INVENTION

Figure 1:
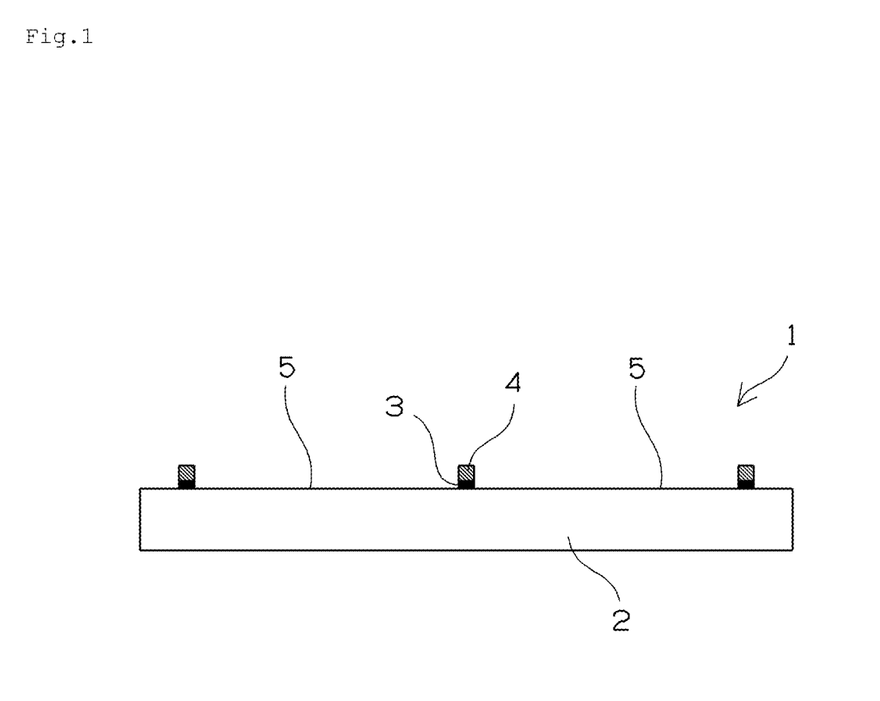
FIG. 1 is a schematic cross-sectional view showing an example of the electromagnetic shield of the present invention.
Figure 2:
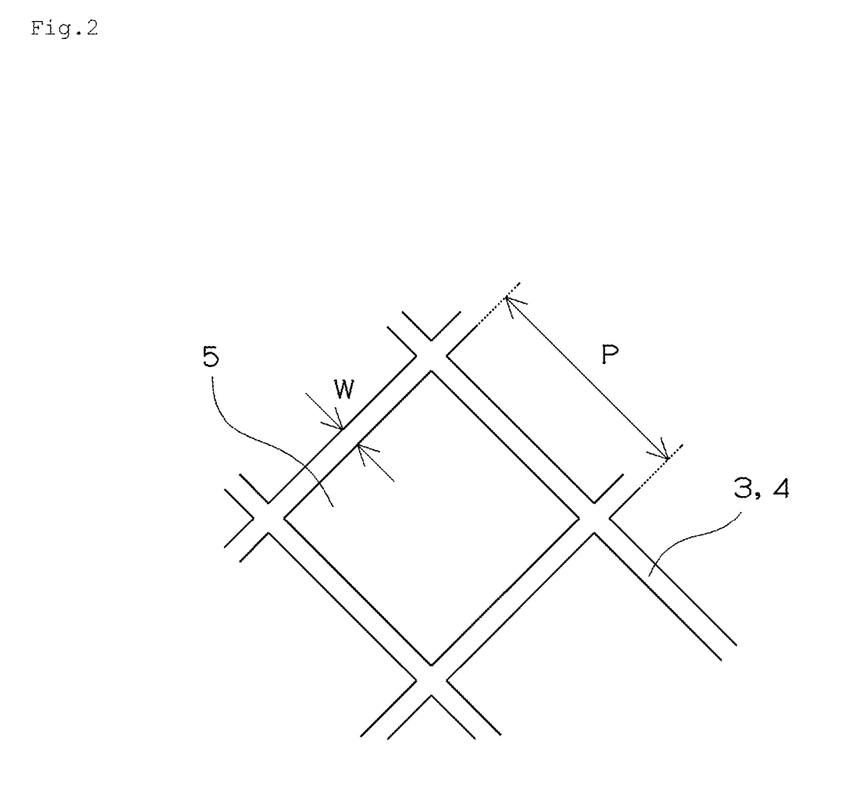
FIG. 2 is an enlarged view of the surface on which the electroconductive layer is formed.

An example of the electromagnetic shield of the present invention is described on the basis of FIGS. 1 and 2. FIG. 1 is a schematic cross-sectional view showing an example of the electromagnetic shield, the illustration exaggerating the thickness of each of the layers more than the actual thickness for the sake of the description. FIG. 2 is an enlarged view of the surface on which the electroconductive layer is formed. In the electromagnetic shield 1 of this embodiment, an intermediate layer 3 is formed on a glass substrate 2, and an electroconductive layer 4 of Al is formed thereon, as shown in FIG. 1. After the intermediate layer 3 and the electroconductive layer 4 are formed by sputtering or vacuum deposition, openings 5 are formed by wet etching.

The glass substrate 2 is a translucent insulating substrate, for which soda lime glass, quartz glass, borosilicate glass, non-alkali glass containing no alkali components, or the like can be employed. In the present invention, soda lime glass is preferably used due to its high transmittance and extremely low cost when used in window glass of common building materials. The thickness of the glass substrate 2 is approximately 0.2-1.8 mm, and preferably approximately 0.5-1.2 mm.

The intermediate layer 3 is a layer comprising a mixture of (1) at least one metal selected from Cr, Mo, and W, and (2) at least one oxide selected from oxides of Si, oxides of Al, and oxides of Ti. $SiO_2$ is an example of an oxide of Si, $TiO_2$ is an example of an oxide of Ti, and $Al_2O_2$ is an example of an oxide of Al. The intermediate layer 3 is formed on the surface of the glass substrate 2 by sputtering or vacuum deposition, which is a vacuum process, using a solid target (a vapor deposit) of the mixture described above. Particularly, it is preferable to form the film by sputtering because a uniform film can be formed and it is easy to ensure stable shielding and visibility characteristics. Sputtering involves bombarding the solid target with accelerated argon ions, and causing the atoms or molecules scattered from the target surface to adhere to the glass substrate to form a film.

The intermediate layer is a layer (a black layer) that absorbs incident light due to the interference of visible light, and appears black. The Al electroconductive layer is extremely reflective of visible light (wavelengths of approximately 400-700 nm) and is prone to glare, and the visibility characteristics of the display is therefore significantly reduced when only an Al electroconductive layer is formed on the glass substrate. In the present invention, the intermediate layer is interposed between the glass substrate and the Al electroconductive layer, thereby reducing reflectance of visible light.

Figure 4:
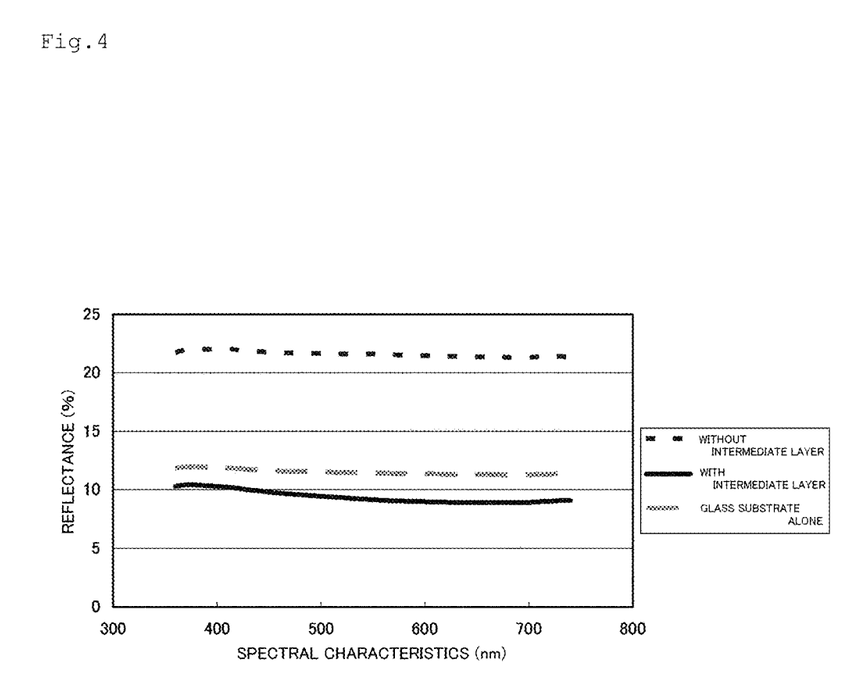
FIG. 4 is a graph showing the effect that including or withholding the intermediate layer has on the spectral characteristics of reflectance.

FIG. 4 shows an example of the spectral characteristics of reflectance depending on whether or not the intermediate layer is included. In FIG. 4, the term "with intermediate layer" indicates that a target of a mixture of Mo and $Al_2O_3$ (containing 10 wt. % of $Al_2O_3$) is used to form an intermediate layer (100 nm) by sputtering on a soda lime glass substrate (0.7 mm), and an Al electroconductive layer (1000 nm) of 99% purity is formed by sputtering on the intermediate layer. The term "without intermediate layer" indicates that in the configuration described above, an intermediate layer is not formed and only an Al electroconductive layer (1000 nm) is formed. Without the intermediate layer, reflectance is much higher than that of the glass substrate, and the visibility characteristics are poor, as shown in FIG. 4. It is therefore apparent that it is favorable to provide the intermediate layer, which makes reflectance much less than in the case of the glass substrate alone. It is also apparent that with all wavelengths, the spectral characteristics are mostly flat and there is no coloration.

The mixture composition ratio of the intermediate layer has an effect on reflectance and the like. Consequently, to form a film having a desired composition ratio, it is preferable during the film forming to use a solid target of the mixture in which the metal and the oxide have been substantially uniformly mixed in advance in the desired composition ratio. In the present invention, metals constituting oxides and metals solely comprising a metal overlap in the intermediate layer, and a film of the composition described above therefore cannot be formed by a method of using a solid target of only metal and a mixed gas of argon and oxygen.

In the mixture composition ratio of the intermediate layer, the oxide content relative to the total amount of the mixture (metal alone+oxide) is preferably 2-16 wt. %. When the oxide content is less than 2 wt. %, a metallic luster emerges and it might not be possible to reduce reflectance. When the oxide content exceeds 16%, cloudiness emerges and it might not be possible to reduce reflectance.

Figure 5:
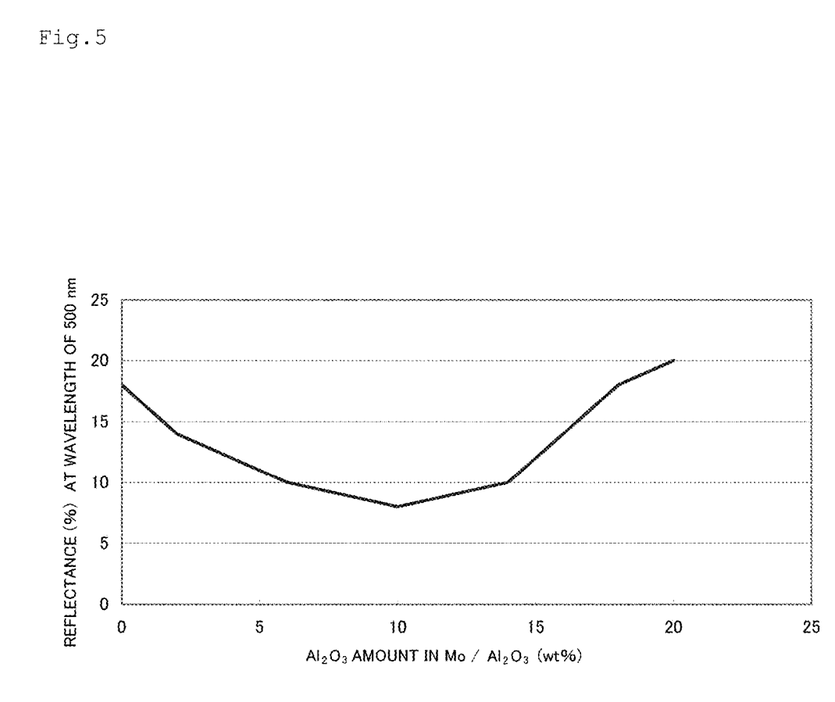
FIG. 5 is a graph showing the effect that the mixture composition ratio of the intermediate layer has on reflectance.

FIG. 5 shows an example of the effect of the mixture composition ratio of the intermediate layer. In FIG. 5, a target of a mixture of Mo and $Al_2O_3$ is used to form an intermediate layer (100 nm) by sputtering on a soda lime glass substrate (0.7 mm), an Al electroconductive layer (1000 nm) of 99% purity is formed by sputtering thereon, and the change in visible light (wavelength 500 nm) reflectance is measured when the amount (wt. %) of $Al_2O_3$ in the mixture is changed. The mixture composition ratio has an optimal range, and when a mixture of Mo and $Al_2O_3$ is used in the intermediate layer, the $Al_2O_3$ content is preferably 2-16 wt. %, more preferably 5-15 wt. %, and even more preferably 8-12 wt. %, as shown in FIG. 5.

An appropriate film thickness for the intermediate layer is 5-500 nm. When the film thickness is less than 5 nm, the layer might not be sufficiently black and reflectance might not be reduced. When the film thickness exceeds 500 nm, there may not be any reflectance-reducing effect from the effect of visible light interference. A more desirable film thickness is 50-200 nm. The film thickness is determined for each material in accordance with the refractive index of the intermediate layer material.

The electroconductive layer 4 comprises Al, the layer 4 being formed on the intermediate layer 3 (on the side opposite the side in contact with the glass substrate). Similarly to the intermediate layer 3, the electroconductive layer 4 is formed by sputtering or vacuum deposition, which is a vacuum process, using a solid target (a vapor deposit) of Al. An appropriate film thickness for the electroconductive layer is 500-5000 nm. When the film thickness is less than 500 nm, it might not be possible to ensure the desired shielding characteristics. When the film thickness exceeds 5000 nm, the shielding characteristics will be exceptional, but there will be more steps and manufacturing costs will rise. A more preferable film thickness is 800-3500 nm.

The openings 5 of the intermediate layer 3 and the electroconductive layer 4, shown in FIGS. 1 and 2, are formed by wet etching. As an example, the openings are obtained by using a resist to form a mask layer having an etching pattern by screen printing or the like, and using a predetermined etching liquid to remove the portions corresponding to the openings by wet etching. Manufacturing efficiency is exceptional when a liquid that can simultaneously etch the materials of the intermediate layer and the electroconductive layer is selected as the etching liquid. For example, a phosphate etching liquid is suitable. In FIG. 2, the shape of the openings 5, i.e., the etching pattern is a grid, but is not limited as such. When the pattern is a grid, normally 5-50 µm is chosen as the line width W and 50-500 µm is chosen as the line pitch P. If the opening ratio is reduced, the shielding characteristics improves but the display transmittance is poor; therefore, the opening ratio is decided in accordance with the required characteristics.

Figure 3:
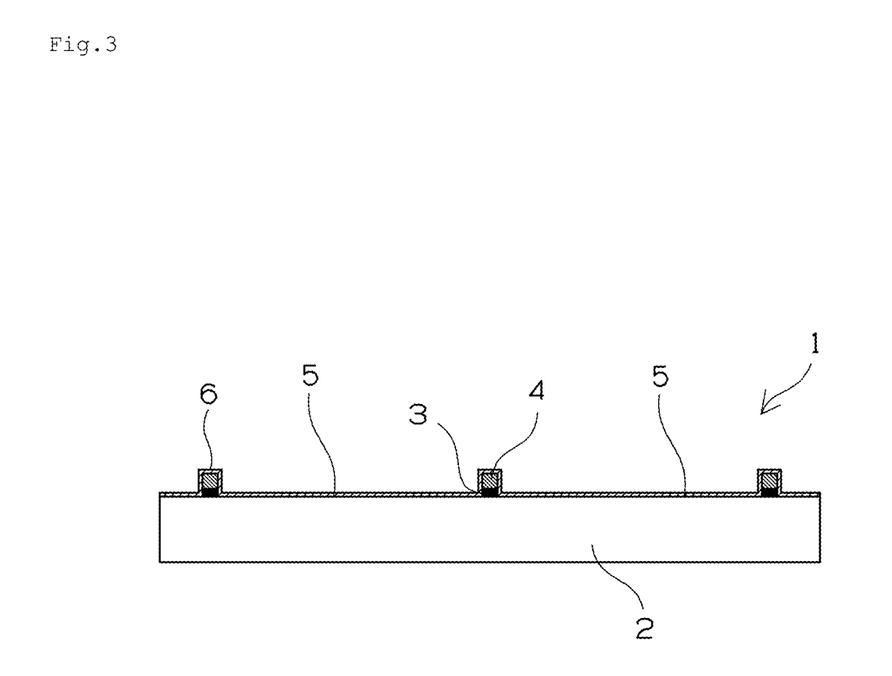
FIG. 3 is a schematic cross-sectional view showing another example of the electromagnetic shield of the present invention.

Another example of the electromagnetic shield of the present invention is described with reference to FIG. 3. FIG. 3 is a schematic cross-sectional view showing another example of an electromagnetic shield, and similarly to FIG. 1, the illustration exaggerates the thickness of each layer more than reality for the sake of the description. In the electromagnetic shield 1 of this embodiment, an intermediate layer 3 is formed on a glass substrate 2 comprising soda lime glass, an electroconductive layer 4 comprising AL is formed thereon, and openings 5 are formed by wet etching in the intermediate layer 3 and the electroconductive layer 4 after these layers have been formed by sputtering or vacuum deposition, as shown in FIG. 3. In this embodiment, an ITO layer 6 is also formed on the glass surface including the intermediate layer 3 and the electroconductive layer 4 after the openings 5 are formed. The ITO layer is preferably formed on the surface in the glass substrate on which at least an electroconductive layer or the like is formed (see FIG. 3), but the ITO layer may also be formed on another surface.

The ITO layer 6 is formed by sputtering or vacuum deposition, which is a vacuum process, similarly to the intermediate layer 3 and the electroconductive layer 4. A mixture of $In_2O_3:SnO_2=95:5$ (wt. %) can be used for the ITO, but the composition is not particularly limited. An appropriate film thickness for the ITO layer is 5-500 nm. When the film thickness is less than 5 nm, there is a risk that it will not be possible to sufficiently ensure environmental resistance. If the film thickness exceeds 500 nm, there is a risk that transmittance will be reduced by the colored ITO layer.

Figure 6:
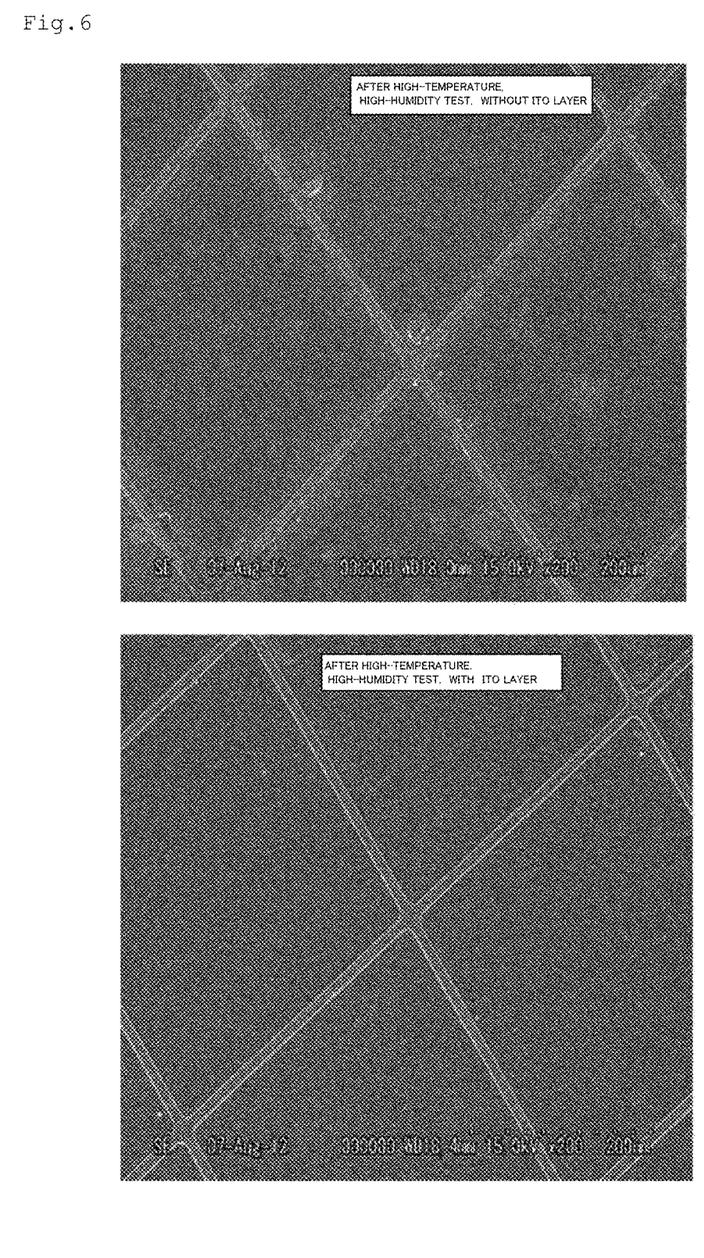
FIG. 6 is a view of electron microscope images showing the glass surface after testing at high temperature and high humidity.

Due to the coating of an ITO layer, the soda lime glass surface does not come into direct contact with water vapor in the atmosphere, and the Na in the soda glass does not convert to NaOH. Because the combined front surfaces of the Al electroconductive layer and the intermediate layer are covered by the ITO layer, there is no reaction between the Al, the Ca in the glass, and the NaOH. As a result, clouding of the glass can be prevented. This makes it possible to significantly confirm the effects by performing high-temperature, high-humidity testing at 60° C. in a relative humidity of 95%. FIG. 6 shows electron photomicrographs of the glass surface after testing for 1000 hours at 60° C. in a relative humidity of 95%. The upper photograph in FIG. 6 shows a case in which no ITO layer is formed (equivalent to Example 1 described hereinafter), and the lower photograph shows a case in which an ITO layer is formed (equivalent to Example 2 described hereinafter). In the case with no ITO layer, there is much clouding of the glass surface, but the case provided with an ITO layer exhibits mostly no change and is favorable. In the case with no ITO layer, it was confirmed that some of the Mo in the intermediate layer had moved to the opening portions and crystallized.

The electromagnetic shield of the present invention is primarily utilized as a shield window disposed on a PDP, a CRT, a VFD, an LCD, or another type of display.

EXAMPLES

Example 1

An intermediate layer was formed by sputtering on a soda lime glass substrate 0.7 mm in thickness, using a target made of a mixture of Mo and $Al_2O_3$ (the $Al_2O_3$ content being 10 wt. %). The film thickness of the intermediate layer was 100 nm. Next, an Al electroconductive layer of 99% purity was formed by sputtering. The film thickness of the electroconductive layer was 1000 nm. A grid pattern 10 μm in line width and 300 μm in line pitch was then formed by wet simultaneous etching, using a phosphate etching liquid. The opening ratio was 93%.

Example 2

An ITO layer was formed by sputtering on the entire surface on which the pattern was formed in Example 1. The film thickness of the ITO layer was 100 nm.

Example 3

An intermediate layer was formed by sputtering on a soda lime glass substrate 0.7 mm in thickness, using a target of a mixture of W and $SiO_2$ (the $SiO_2$ content being 10 wt. %). The film thickness of the intermediate layer was 150 nm. Next, an Al electroconductive layer of 99% purity was formed by sputtering. The film thickness of the electroconductive layer was 3000 nm. A grid pattern 10 μm in line width and 100 μm in line pitch was then formed by wet simultaneous etching, using a phosphate etching liquid. The opening ratio was 74%. An ITO layer was also formed by sputtering on the entire surface on which the pattern was formed. The film thickness of the ITO layer was 100 nm.

Comparative Example 1

An Al electroconductive layer of 99% purity was formed by sputtering on a soda lime glass substrate 0.7 mm in thickness. The film thickness of the electroconductive layer was 1000 nm. A grid pattern 10 μm in line width and 300 μm in line pitch was then formed by wet simultaneous etching, using a phosphate etching liquid. The opening ratio was 93%.

The shielding characteristics of the samples in Examples 1 to 3 and Comparative Example 1 were measured by KEC, and the shielding characteristics at the typical frequency of 30 MHz are shown in Table 1. The reflectance of visible light (500 nm) was also measured, and the effect of the intermediate layer was confirmed. Furthermore, to confirm the effect of the ITO layer, a high-temperature, high-humidity test was performed in which the samples were left for 1000 hours in conditions with a temperature of 60° C. and a relative humidity of 95%, and visual confirmation was made as to whether or not there was clouding of the glass surface. These results are shown collectively in Table 1.

exceptional shielding characteristics. In particular, in Examples 2 and 3 in which the ITO layer was formed, no clouding of the glass surface was observed even in the high-temperature, high-humidity test, and it is clear that these Examples had exceptional environmental resistance as well.

Next, a comparison was made between the electromagnetic shield of the present invention, and a shield member in which a metal Cu foil was bonded to a polymeric film used in conventional practice and patterned by etching.

Comparative Example 2

Polycarbonate was used as the base material, a 15-μm Cu foil was bonded thereto, a pattern 10 μm in line thickness and 300 μm in line pitch was formed by etching, and a shield member was obtained. Table 2 below shows the numerical values of transmittance, reflectance, and shielding characteristics required for the shield member in this Comparative Example 2 and in Example 1. The term "base material" in the table indicates an evaluation of the base material alone, and the term "product" indicates an evaluation of the base material with an electroconductive layer or the like formed thereon.

TABLE 2

|  | Base Material | Transmittance Base Material | Transmittance Product | Reflect. Product | Shielding char. |
|---|---|---|---|---|---|
| Ex. 1 | soda lime glass (0.7 mm) | 94% | 85% | 8% | 40 dB |
| C. Ex. 2 | polycarbonate (0.2 mm) | 87% | 77% | 12% | 40 dB |

As shown in Table 2, Example 1 exhibits more favorable product transmittance than Comparative Example 2 because of the exceptional glass transmittance. Example 1 had low reflectance of visible light due to the effect of the intermediate layer, and the shielding characteristics were similar to conventional practice. Furthermore, because glass was used in Example 1, there was no curling, folding, or the like, and ease of handling was exceptional compared with Comparative Example 2.

INDUSTRIAL APPLICABILITY

The electromagnetic shield of the present invention is inexpensive, has exceptional shielding and display visibility characteristics, and can provide high environmental resistance as necessary; therefore, this electromagnetic shield can be used in desired locations where electromagnetic waves must be blocked, and in particular, the plate can be suitably

TABLE 1

|  | Int. Layer | Al Elec. Layer Thickness | Pattern (μm) | ITO Layer | Shielding Char. | Reflect. | Hi-temp/humid. test |
|---|---|---|---|---|---|---|---|
| Ex. 1 | Mo + $Al_2O_3$ | 1000 nm | w10 p300 | no | 40 dB | 8% | clouding |
| Ex. 2 | Mo + $Al_2O_3$ | 1000 nm | w10 p300 | yes | 40 dB | 8% | no change |
| Ex. 3 | W + $SiO_2$ | 3000 nm | w10 p100 | yes | 60 dB | 10% | no change |
| C. Ex. 1 | no | 1000 nm | w10 p300 | no | 40 dB | 22% | clouding |

It follows from Table 1 that the Examples had low visible light reflectance, exceptional visibility characteristics, and utilized in the application of being installed on the front surface of a PDP, a CRT, a VFD, an LCD, or another display.

EXPLANATION OF REFERENCE NUMERALS AND SYMBOLS

1 Electromagnetic shield
2 Glass substrate
3 Intermediate layer
4 Electroconductive layer
5 Opening
6 ITO layer

The invention claimed is:

1. An electromagnetic shield in which an intermediate layer is formed on a glass substrate and an electroconductive layer of Al is formed on the intermediate layer, wherein the electromagnetic shield is characterized in that:
   after the intermediate layer and the electroconductive layer are formed by sputtering or vacuum deposition, openings in said intermediate layer and said electroconductive layer are formed by wet etching;
   the intermediate layer is a layer that is black when seen from a side of the glass substrate;
   the intermediate layer consists of a mixture of molybdenum and $Al_2O_3$,
   the glass substrate is a soda lime glass substrate and a layer of indium tin oxide is formed on glass surfaces at said openings formed by wet etching and on surfaces of the electroconductive layer and the intermediate layer after said openings are formed by wet etching; and
   when the electromagnetic shield is left to stand for 1000 hours at a temperature of 60° C. and a relative humidity of 95%, there will be no clouding in the glass surface.

2. The electromagnetic shield of claim 1, characterized in that the thickness of the intermediate layer is 5-500 nm, and the thickness of the electroconductive layer is 500-5000 nm.

3. The electromagnetic shield of claim 1, characterized in that the amount of the $Al_2O_3$ contained relative to the total amount of the mixture is 2-16 wt. %.

* * * * *